United States Patent
Brunner et al.

(10) Patent No.: US 6,645,783 B1
(45) Date of Patent: Nov. 11, 2003

(54) METHOD OF PRODUCING AN OPTOELECTRONIC COMPONENT

(75) Inventors: Herbert Brunner, Regensburg (DE); Hans Hurt, Regensburg (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/556,413

(22) Filed: Apr. 24, 2000

Related U.S. Application Data

(62) Division of application No. 09/178,199, filed on Oct. 23, 1998, now abandoned.

(30) Foreign Application Priority Data

Oct. 23, 1997 (DE) .......................................... 197 46 863

(51) Int. Cl.$^7$ .......................... H01L 21/00; H01L 21/44; H01L 27/15; H01L 33/00; H01L 23/48
(52) U.S. Cl. .......................... 438/26; 438/64; 438/614; 438/678; 257/81; 257/99; 257/772
(58) Field of Search .......................... 438/25, 26, 64, 438/67, 614, 676, 687, 612, 652, 674, 677, 678, 118, 125, 129; 257/81, 99, 762, 772, 779, 433, 729, 730, 701, 702

(56) References Cited

U.S. PATENT DOCUMENTS 5,629,564 A * 5/1997 Nye, III et al. .............. 257/762
5,877,561 A   3/1999 Kim .......................... 257/796

FOREIGN PATENT DOCUMENTS

| DE | 31 28 187 A1 | 2/1983 |
|---|---|---|
| EP | 0 062 300 A2 | 10/1982 |
| EP | 0 493 051 A1 | 7/1992 |
| EP | 0 641 152 A1 | 3/1995 |
| JP | 61-002371 A | 1/1986 |
| JP | 02-154134 A | 6/1990 |
| JP | 04-63163 | 5/1992 |
| JP | 09-293800 A | 11/1997 |

OTHER PUBLICATIONS

US 5,814,937, 9/1998, Okazaki (withdrawn)
"The Enhanced and Suppressed Electroless Plating of Copper by UV–Irradiation" (Ishikawa et al.), Japanese Journal of Applied Physics, vol. 27, No. 9, Sep. 1988, pp. 1764–1767.
Derwent Abstract of German Published, Non–Prosecuted Application No. DE 31 28 187 A1 (Sieg et al.), dated Feb. 1983.
Japanese Patent Abstract No. 61096778 (Toru), dated May 15, 1986.
Japanese Patent Abstract No. 01283883 (Tadaaki), dated Nov. 15, 1989.

* cited by examiner

*Primary Examiner*—Olik Chaudhuri
*Assistant Examiner*—Neal Berezny
(74) *Attorney, Agent, or Firm*—Laurence A. Greenberg; Werner H. Stemer; Ralph E. Locher

(57) ABSTRACT

The optoelectronic component has a radiation-receiving or radiation-emitting semiconductor chip mounted on a base part. The chip is contacted with at least two electrode terminals made of an electrically conductive connection material. The electrode terminals are formed by a thin coating, which is deposited on the outer surfaces of the base part, is applied by electrodeposition and is patterned by means of laser etching.

14 Claims, 3 Drawing Sheets

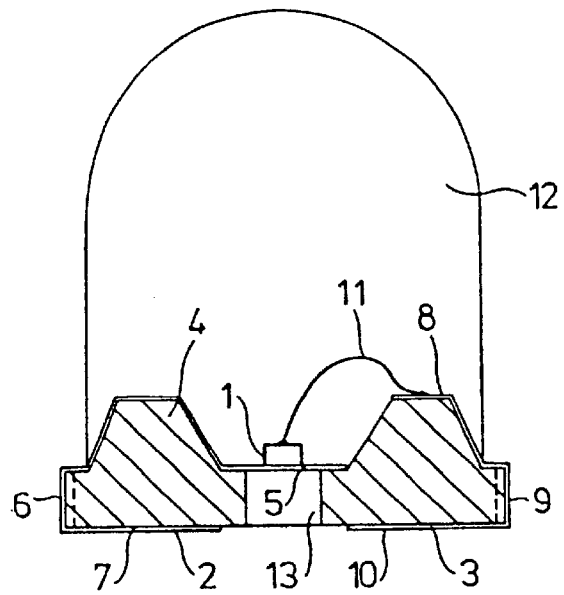

METHOD OF PRODUCING AN OPTOELECTRONIC COMPONENT

CROSS-REFERENCE TO RELATED APPLICATION

This is a division of U.S. application Ser. No. 09/178,199, filed Oct. 23, 1998 now abandoned.

BACKGROUND OF THE INVENTION

FIELD OF THE INVENTION

The invention relates to an optoelectronic component having a radiation-receiving or radiation-emitting semiconductor chip, which is fastened to or on a base part and is connected to at least two electrode terminals made of an electrically conductive material. The electrode terminals serve to electrically contact the component. The invention furthermore relates to a method for producing such an optoelectronic component.

Optoelectronic semiconductor components of this type are mass-produced. They serve as transducers to convert optical signals or energy into electrical signals or energy, or vice versa. Radiation receivers or radiation-sensitive components are, for example, photodiodes or phototransistors. Transmitters or radiation-emitting components include (visible) light-emitting diodes (LED) and infrared radiation-emitting diodes (IRED). These optoelectronic components are expediently produced in the wafer composite and, after completion, are separated from the wafer composite in the form of parallelepipedal chips. Depending on the purpose of use, the finished semiconductor chips are then fastened to a suitable carrier, contact-connected and embedded in an encapsulation made of transparent plastic. In addition to affording protection for the semiconductor chip as well as the contact wires, the plastic encapsulation is additionally ascribed the function of improved radiation input coupling and radiation output coupling in and on the chip.

In addition to the ubiquitously known radial designs with a plastic housing and elongate electrode terminals which is protrude to one side, designs of light-emitting diodes which are also suitable, in particular, for surface mounting are known, in which a so-called lead frame is provided as a prefabricated carrier part for the semiconductor chip, and the electrode terminals are small legs that are routed laterally from the plastic housing and bent. In the course of producing such LEDs for surface mounting, an endlessly stamped conductor strip is encapsulated by injection molding with a thermoplastic which is resistant to high temperature. In a further method technique, the light-emitting diode is fitted into a holder suitable for surface mounting only after the potting fabrication. German published patent application DE 31 28 187 A1 discloses an optoelectronic component. The component has a radiation-receiving or radiation-emitting semiconductor chip fastened to a base part and connected to two electrode terminals. The two connections are applied in a planar manner to the carrier, are connected to the semiconductor body and extend from that outer surface of the carrier which carries the semiconductor body as far as at least one further outer surface of the carrier, where they form a connection contact area.

German published patent application DE 19 21 124 A1 discloses an optoelectronic transducer with a semiconductor chip fastened to a carrier unit. The carrier unit has a chip mounting region which is assigned a number of connection parts. These connection parts are provided with electrical connection areas which define a plane whose spacing from the chip mounting region is greater than the maximum height of the semiconductor chip, if appropriate including all the connecting conductors and/or covering means referring to the chip mounting region.

Japanese J. Appl. Physics, Vol. 27, 1988, pp. L1764-L1767 discloses a method in which an insulating substrate is covered with a thin coating of copper by means of deposition from a liquid chemically and without the action of an external current flow, i.e. by electroless plating. The copper coating is then etched selectively with the aid of photolithography, a mask layer being deposited and patterned. As a result, regions of the coating which are not covered and those which are covered by the mask material are identified, and the regions which are not covered by the material of the mask layer are selectively removed by means of etching.

SUMMARY OF THE INVENTION

It is accordingly an object of the invention to provide an optoelectric component and production method, which overcomes the disadvantages of the heretofore-known devices and methods of this general type and which specifies an optoelectronic component, in particular SMT optocomponent (SMT=Surface Mounted Technology) and a method for its production which, with an even further reduced structural size of the component, enables cost-effective production in particular in conjunction with high numbers, even with different designs.

With the foregoing and other objects in view there is provided, in accordance with the invention, an optoelectronic component, comprising:

a base part having outer surfaces;

a radiation-receiving or radiation-emitting semiconductor chip mounted on the base part;

at least two electrode terminals of electrically conductive material connected to the chip and extending on the outer surfaces of the base part, the electrode terminals being formed by a patterned, thin coating on the outer surfaces of the base part.

In accordance with an added feature of the invention, the surfaces of the base part include a top side facing the semiconductor chip, an underside opposite the top side, and edge portions between the top side and the underside, and wherein the electrode terminals extend from the top side of the base part, across the edge portions and to the underside of the base part.

In accordance with an additional feature of the invention, the underside of the semiconductor chip is seated on one of the electrode terminals.

In accordance with another feature of the invention, the base part is provided with a heat sink of thermally conductive material that is in thermal contact with the semiconductor chip.

With the above and other objects in view there is also provided an improved method of producing an optoelectronic component of the type described above. The improvement comprises the step of coating outer surfaces of the base part with a thin layer of electrically conductive connection material, and patterning the coating to form the electrode terminals.

In accordance with a further feature of the invention, the method comprises:

covering the base part with a thin coating made of the electrically conductive connection material by deposition from a liquid;

patterning the thin coating so as to form individual regions of the coating that are electrically insulated from one another;

selectively depositing a further thin layer of auxiliary material on a number of predetermined regions of the thin coating by electrodeposition with external electric current, for increasing a layer thickness of the thin coating at the predetermined regions; and selectively removing regions of the thin coating on base part that have not been thickened in the depositing step by means of etching.

In accordance with again a further feature of the invention, the covering step comprises depositing the thin coating chemically and without an external electric current.

In accordance with again an added feature of the invention, the patterning step comprises patterning the mask layer with a beam selected from the group consisting of a light beam, a particle beam, and a laser beam.

In accordance with again an additional feature of the invention, the removing step comprises removing the non-masked conductive material by wet chemical etching.

In accordance with again a further feature of the invention, the base part is coated with the electrically conductive connection material on all sides.

In a preferred embodiment, the connection material of the thin base part coating comprises copper.

In accordance with yet another feature of the invention, the base part is composed of plastic and prefabricated in an injection-molding process.

In accordance with a concomitant feature of the invention, the material of the mask layer comprises tin.

With the above and other objects in view there is also provided, in accordance with the invention, a method of producing an optoelectronic component, which comprises:

covering a base part with a thin coating of electrically conductive connection material by depositing from a liquid, preferably chemically without an external current;

depositing a mask layer on the thin base part coating;

patterning the mask layer and identifying regions of the thin base part coating that are not covered and regions that are covered by the mask;

selectively etching and removing the thin base part coating in the regions that are not covered by the mask; and mounting a radiation-receiving or radiation-emitting semiconductor chip on the base part and electrically connecting the semiconductor chip to the electrically conductive connection material forming at least two electrode terminals of the component.

In other words, a first version of the production method is distinguished by the fact that the base part is covered with a thin coating made of the electrically conductive connection material by means of deposition from a liquid, in particular chemically and without the action of an external electric current flow, the thin coating of the base part is patterned and, in the process, individual regions of the coating, which are electrically insulated from one another, are fabricated, a further thin layer made of an auxiliary material is deposited, by electrodeposition under the action of an external electric current flow, selectively on a number of predetermined regions of the thus fabricated regions of the thin coating, as a result of which the layer thickness of these predetermined regions of the coating is increased, and the unthickened regions of the base part coating are selectively removed by means of etching.

A further method according to the invention is distinguished by the fact that the base part is covered with a thin coating made of the electrically conductive connection material by means of deposition from a liquid, in particular chemically and without the action of an external electric current flow, a mask layer is deposited on the thin base part coating, the mask layer is patterned, as a result of which regions of the base part coating which are not covered and those which are covered by the mask material are identified, and the regions which are not covered by the material of the mask layer are selectively removed by means of etching.

The particular advantages achieved by the invention are that the use of a prefabricated plastic base part, preferably plastic injection-molded part, on which the electrode terminals serving for the electrical contact-making of the component are applied using a patterned coating technique, means that it is possible to produce optocomponents for surface mounting technology (SMT) with smaller structural heights and with essentially low manufacturing costs. On account of flexible process control, the invention makes it possible to produce a wide variety of different designs and electrode terminal forms; a plurality of components in an interconnection, so-called arrays, can be produced in an equally cost-effective and simple manner. A wide range of component modifications can be covered with just one base part. If the component is an LED, for example, the base part is substantially simpler in terms of its configuration than the conventional LED carriers with lead frame and/or with embossed reflector.

Other features which are considered as characteristic for the invention are set forth in the appended claims.

Although the invention is illustrated and described herein as embodied in an optoelectronic component and method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic sectional view of a completed optoelectronic component in the form of a light-emitting diode with a lens for surface mounting;

FIG. 2 is a partial diagrammatic plan view onto the LEDs fabricated in the board interconnection;

DESCRIPTION OF THE PREFERRED EMBODIMENTS

Figure 3A:
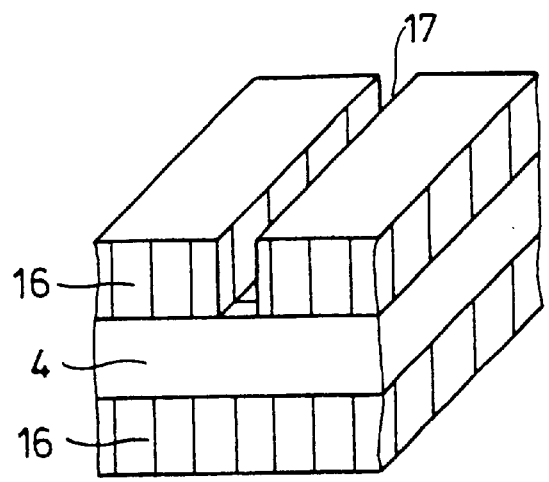
FIGS. 3A to 3C are partial perspective, diagrammatic views illustrating successive process steps for fabricating the base part according to a first exemplary embodiment of the invention.

Referring now to the figures of the drawing in detail and first, particularly, to FIG. 1 thereof, there is seen a light-emitting diode (LED) that is illustrative as an exemplary embodiment of the optoelectronic component according to the invention. A semiconductor chip 1 forms the radiation-emitting element of the LED. A base part 4—a chip carrier—is coated, on predetermined portions of its outer surfaces, with two electrode terminals 2, 3 made of an electrically conductive material which, in particular, includes copper. In this case, the electrically conductive area of the first electrode terminal 2, proceeding from a portion 5 on the top side of the base part 4, said top side facing the semiconductor chip 1, extends across edge portions 6 as far as portions 7 on the underside of the base part 4. Correspondingly, the area of the second electrode terminal 3 extends on the other side of the base part 4, proceeding from a portion 8, across edge portions 9 as far as portions 10 on the underside of the base part 4. The semiconductor chip 1 is expediently fastened by means of a suitable conductive adhesive on the portion 5 of the electrode terminal 2. Contact is made between the chip 1 and the second electrode terminal 3 via a bonding wire 11. A lens part 12 made of transparent plastic is formed on the base part 4. The base part 4 may have an incorporated heat sink 13 made of copper.

A plurality of optoelectronic components or base parts with the electrode terminals are expediently fabricated simultaneously in one work operation. FIG. 2 shows a carrier body 14 in the form of a board made of a suitable high-temperature thermoplastic material. The carrier body is prefabricated for this purpose by an injection-molding process and is provided with perforations 15 between the base parts 4 which are to be separated later. The perforations 15 serve two purposes, namely, a transport tool for conveying the carrier 14 and a separating tool for separating the components can engage there. The electrode terminals 2, 3 are fabricated first of all in the board-type carrier body 14 of the base parts, which electrode terminals serve as conductor tracks for the chip mounting and for the electrical contact-making of the component for surface mounting (SMT).

The electrode terminals are fabricated in accordance with a first exemplary embodiment, which is explained below with reference to FIGS. 3A to 3C, or using a second exemplary embodiment, which is elucidated in FIGS. 4A to 4C.

After the completion of the base part 4 with electrode terminals 2, 3—still in the interconnection of the body 14—the semiconductor chip 1 is bonded and the connecting wire 11 is contacted. If required, the base part can be configured in such a way that it is also possible to mount a plurality of semiconductor chips per structural part, as a rule more than two electrode terminals being required in this case. The lens 12 is subsequently applied. This can be carried out using a suitably designed molding plate whose molds form the lens body and which can be aligned with the chip carrier composite. The individual molds are filled with epoxy resin, for example, and the chip carrier substrate is centered with the face downward onto the molding plate. After initial curing of the epoxy resin for the lenses, the substrate is released from the mold and the epoxy resin lenses can still be post-cured if required. Subsequently, the chip carrier body 14 provided with the lenses is separated into individual structural parts or else arrays by means of a sawing process. For optimal wiring up, the "conductor tracks" of the electrode terminals 2, 3 can likewise be severed by sawing. Subsequently, the separated components or arrays can, with the use of an automatic machine, be tested and packaged. The packaging can be effected either in so-called tapes or else in tubes, particularly in the case of arrays. Moreover, further packagings can be used, for example by means of a structural part carrier sheet or the like.

Although the chip carrier body 14 is composed of a plastic material in the particularly preferred embodiment, in principle, it is also possible to use a metal plate which, for the purpose of electrical insulation, is either provided with inserts or is coated by means of a plastic film. In this case, the carrier body 14 can also be designed as a reusable structural part for the purpose of further reducing the manufacturing costs.

Moreover, the molding plate for fabricating the lenses can be configured in such a way that the individual lens molds are connected to one another, and, during the casting of the lenses, level adjustment of the casting composition can take place in order to ensure an accurate cast height. Overflow reservoirs can additionally be fitted. Furthermore, holes for ejector pins may be present between the molds for the lenses, in order to enable or simplify the release from the mold. In order to minimize the stress of release from the mold and to maximize the accuracy, the expansion coefficients of chip carrier body 14 and molding plate should be matched as well as possible; the use of a carrier body made of LCP material (liquid-crystalline polymer) and a molding plate made of metal is expedient in this case.

Figure 3B:
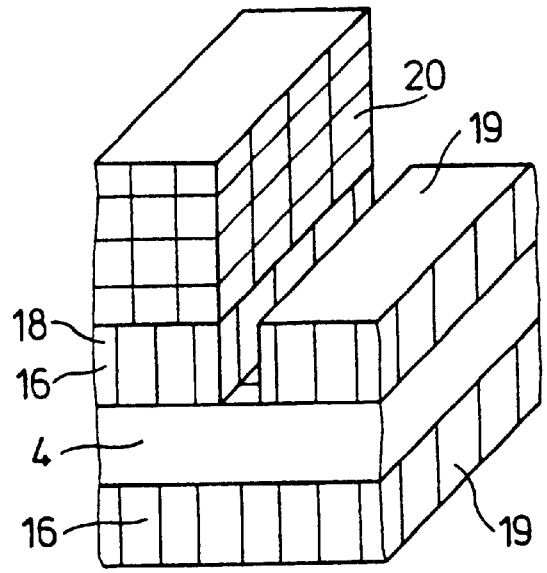
Figure 3C:
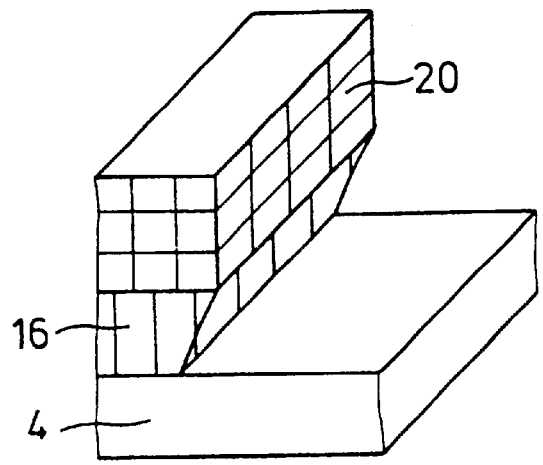

FIGS. 3A to 3C diagrammatically show the successive process steps for fabricating the base parts 4, situated in an interconnection, with the electrode terminals in accordance with a first exemplary embodiment of the invention. According to FIG. 3A, in a first step, the base part 4 is covered on all sides with a thin coating 16 made of the electrically conductive connection material, in particular copper, by means of deposition from a liquid. This deposition is carried out chemically, that is to say without the action of an external electric current flow. This is followed by the patterning of the base part coating 16 under the action of a particle or light beam, in particular a laser beam. At the locations where the laser beam is guided, patterning trenches 17 reaching down to the material of the base part 4 are produced as a result of vaporization of the connection material. The trenches in each case electrically insulate neighboring regions of the connection material 16 from one another. In a subsequent work step, according to FIG. 3B, a further thin layer 20 made of an auxiliary material, in particular having copper again, is applied selectively on a number of predetermined regions of the regions 18 fabricated in such a way, by means of electrodeposition, that is to say under the action of an external electric current flow through the affected region 18. In this way, the layer thickness of this region 18 is increased by the value of the layer thickness of the material 20, while the regions 19 to which an electric current is not applied remain unchanged. Subsequently, according to FIG. 3C, the unthickened regions 19 of the base part coating can be completely removed by means of wet-chemical etching, the layer thickness of the region 20 being slightly reduced after the etching.

Figure 4A:
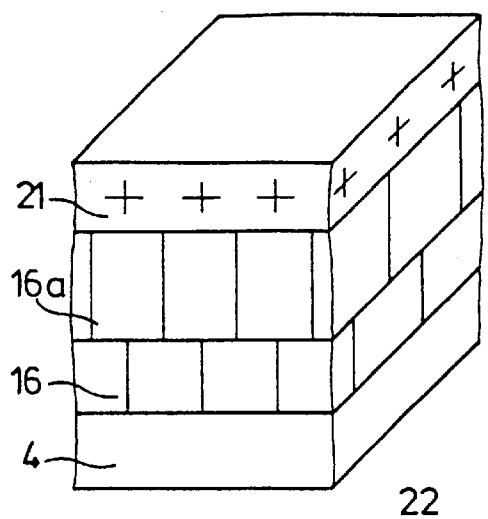
FIGS. 4A to 4C are partial perspective, diagrammatic views illustrating successive process steps for fabricating the base part according to a second exemplary embodiment of the invention.
Figure 4B:
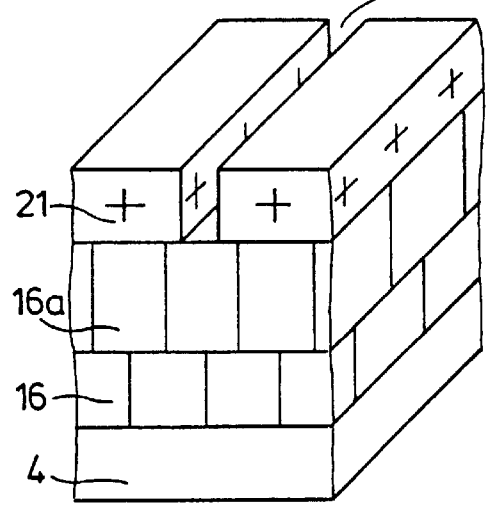
Figure 4C:
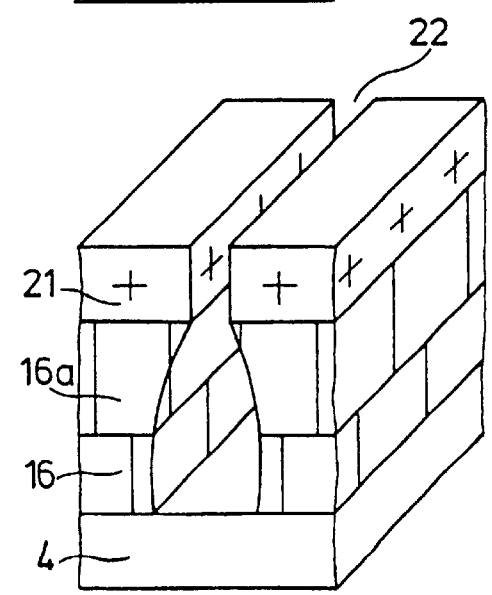

FIGS. 4A to 4C show, in successive work steps, a second exemplary embodiment for the fabrication of the base parts 4 with electrode terminals 2, 3. Once again, in a first step, a thin coating 16 made of the electrically conductive connection material is applied on all sides chemically, that is to say without the action of an external electric current flow, it being the case that in FIGS. 4A to 4C, in order to impart greater clarity to the illustration, the coating is shown only on the top side of the base part 4, and a more detailed illustration of the underside is omitted. The thickness of the coating 16 can be increased by (chemical or else electrical) application of further material 16a. Chemical coating with a thin mask layer 21, for example made of tin material, preferably follows. According to FIG. 4B, the mask layer 21 is patterned, to be precise under the action of a particle or light beam, in particular laser beam. According to FIG. 4C, the pattern of the mask 21 is transferred wet-chemically to the coating 16, 16a, that is to say the regions which are not covered by the material of the mask layer 21 are selectively removed by means of etching. In this way, the desired structure of the extensive electrode terminals 2 and 3 can be produced with comparatively low manufacturing costs.

We claim:

1. In a method of producing an optoelectronic component, wherein a radiation-receiving or radiation-emitting semiconductor chip is mounted on a base part and is connected to at least two electrode terminals of electrically conductive connection material, and the component is contacted via the electrode terminals, the improvement which comprises:

covering the base part with a thin coating made of the electrically conductive connection material including copper by deposition from a liquid;

patterning the thin coating to form individual regions of the coating electrically insulated from one another;

selectively depositing a further thin layer of auxiliary masking material including tin, on a number of predetermined regions of the thin coating by electrodeposition with external electric current, for increasing a layer thickness of the thin coating at the predetermined regions;

selectively removing, by etching, regions of the thin coating on the base part that have not been thickened in the depositing step; and mounting the radiation-receiving or radiation-emitting semiconductor chip on at least one of the base part and the auxiliary masking material and electrically connecting the semiconductor chip to at least one of the electrically conductive connection material and the auxiliary masking material forming the at least two electrode terminals of the component.

2. The method according to claim 1, wherein the covering step comprises depositing the thin coating chemically and without an external electric current.

3. The method according to claim 1, wherein the patterning step comprises patterning the thin coating with a beam selected from the group consisting of a light beam, a particle beam, and a laser beam.

4. The method according to claim 1, wherein the removing step comprises removing conductive material by wet chemical etching.

5. The method according to claim 1, wherein the base part is coated with the electrically conductive connection material on all sides.

6. The method according to claim 1, wherein the connection material of the thin base part coating comprises copper.

7. The method according to claim 1, wherein the base part is composed of plastic and prefabricated in an injection-molding process.

8. A method of producing an optoelectronic component, which comprises:

providing a base part;

covering the base part with a thin base part coating of electrically conductive connection material by depositing from a liquid;

depositing a thin layer of auxiliary masking material including tin, on the thin base part coating and patterning the auxiliary masking material to form a mask with regions of the thin base part coating covered by the auxiliary masking material and regions not covered by the auxiliary masking material;

selectively etching and removing the thin base part coating in the regions that are not covered by the auxiliary masking material; and mounting a radiation-receiving or radiation-emitting semiconductor chip on the base part and electrically connecting the semiconductor chip to the electrically conductive connection material forming at least two electrode terminals of the component.

9. The method according to claim 8, wherein the covering step comprises depositing the thin coating chemically and without an external electric current.

10. The method according to claim 7, wherein the patterning step comprises patterning the auxiliary masking material layer with a beam selected from the group consisting of a light beam, a particle beam, and a laser beam.

11. The method according to claim 8, wherein the removing step comprises removing conductive material by wet chemical etching.

12. The method according to claim 8, wherein the base part is coated with the electrically conductive connection material on all sides.

13. The method according to claim 8, wherein the connection material of the thin base part coating comprises copper.

14. The method according to claim 8, wherein the providing step comprises providing a base part composed of plastic and prefabricated in an injection-molding process.

* * * * *

UNITED STATES PATENT AND TRADEMARK OFFICE
CERTIFICATE OF CORRECTION

PATENT NO.     : 6,645,783 B1                          Page 1 of 1
DATED          : November 11, 2003
INVENTOR(S)    : Herbert Brunner et al.

It is certified that error appears in the above-identified patent and that said Letters Patent is hereby corrected as shown below:

<u>Title page,</u>
Item [30], Foreign Application Priority Data, should read as follows:

-- Oct. 23, 1997          (DE)          ………….. 197 46 893.4 --

Signed and Sealed this

Seventeenth Day of February, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,645,783 B1
DATED : November 11, 2003
INVENTOR(S) : Herbert Brunner et al.

It is certified that error appears in the above-identified patent and that said Letters Patent is hereby corrected as shown below:

Column 8,
Line 29, should read as follows:
10. The method according to claim 8, wherein the pat- Signed and Sealed this Twentieth Day of July, 2004

JON W. DUDAS
*Acting Director of the United States Patent and Trademark Office*